(12) United States Patent
Peterson et al.

(10) Patent No.: US 6,397,050 B1
(45) Date of Patent: May 28, 2002

(54) MULTIBAND SQUELCH METHOD AND APPARATUS

(75) Inventors: Maurice W. Peterson, Swisher; Mathew S. Chackalackal, Iowa City; Richard A. Groshong, Marion, all of IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/290,726

(22) Filed: Apr. 12, 1999

(51) Int. Cl.[7] .............................. H04B 17/00; H04B 1/16
(52) U.S. Cl. ...................... 455/221; 455/218; 455/212
(58) Field of Search ............................... 455/218, 222, 455/225, 221, 212, 213; 704/223, 226, 227, 228; 381/71.14, 73.1, 94.1, 94.2, 94.3

(56) References Cited

U.S. PATENT DOCUMENTS

| | | | | |
|---|---|---|---|---|
| 3,873,926 A | * | 3/1975 | Wright | 455/225 |
| 4,143,325 A | * | 3/1979 | Kahn | 455/222 |
| 4,187,396 A | * | 2/1980 | Luhowy | 704/233 |
| 4,414,689 A | | 11/1983 | Enderson | 455/221 |
| 4,484,344 A | * | 11/1984 | Mai et al. | 704/233 |
| 4,715,065 A | * | 12/1987 | Parker | 704/233 |
| 6,208,848 B1 | * | 3/2001 | Bertrana | 455/218 |

\* cited by examiner

Primary Examiner—Vivian Chang
Assistant Examiner—Charles N. Appiah
(74) Attorney, Agent, or Firm—Nathan O. Jensen; Kyle Eppele

(57) ABSTRACT

A squelch circuit for a radio receiver that detects the presence of speech by utilizing a filter bank for filtering an intermediate frequency or baseband signal from the radio receiver into band-pass signals, detecting the magnitude of the band-pass signals, and separating the signal magnitudes into a speech and noise detector. The speech detector determines if speech is present by determining if syllabic variations are present in the speech detector signals and selects a voice band average signal with a maximum difference in syllabic variations, and generates a speech detector decision when speech is present. The noise detector makes a noise detector decision when speech is present by obtaining a minimum noise detector signal and comparing the minimum noise detector signal to a threshold scaled voice band average signal associated with the maximum difference in syllabic variations. A final decision is made when the speech detector decision and the noise detector decision both indicate speech and the audio output is enabled and held on for a predetermined hold time.

14 Claims, 4 Drawing Sheets

MULTIBAND SQUELCH METHOD AND APPARATUS

BACKGROUND OF THE INVENTION

This invention relates to radio communications systems receivers and more specifically to a radio receiver squelch circuit.

Squelch circuits have long been used in radio communications receivers. A squelch circuit causes the audio output signal coming from a loudspeaker or headphones to be muted or turned off when there is no modulated voice signal. When a desired voice signal appears in the radio receiver, the squelch circuit turns on the audio output signal to the loudspeaker or headphones. The squelch circuit serves to turn off the audio output when no desired signal is present to eliminate the noise and other interference on a communications channel when no signal is present to reduce radio operator fatigue.

Many different types of squelch circuits have been developed. The simplest squelch circuits include those that sense the presence of a signal carrier in the radio receiver by sensing the automatic gain control (AGC) voltage level and comparing it to an adjustable threshold level. These squelch circuits often trigger on signals other than voice such as a burst of noise or an unmodulated carrier wave (CW). This turning on or triggering of the audio output in the presence of undesired signals has resulted in the development of alternate squelch circuits.

An alternate form of squelch circuit in use on amplitude modulated (AM) radios is the AM quieting noise squelch circuit. In this type of squelch circuit, signal presence is sensed by comparing the signals from the AM detector in a low-frequency band-pass channel to a high-frequency band-pass channel. With no signal, noise in the high-frequency channel exceeds the signal in the low-frequency channel. When a signal is present in the radio, the amount of noise is reduced in the high-frequency channel due to AGC and the signal in the low-frequency channel increases to exceed the high-frequency channel. The audio is then turned on. A noise quieting type squelch circuit can be falsely triggered by an undesired signal such as any CW signal in the receiver pass band.

To overcome squelch triggering by CW signals, syllabic filters have been added to the low-frequency channel to sense the syllabic or very low-frequency component in speech. This feature, along with others such as automatic level control, is disclosed in U.S. Pat. No. 4,414,689 incorporated herein by reference and hereinafter referred to as the '689 patent. The basic principle of the squelch circuit of the '689 patent is that the noise band channel looks for a noise sample whereas the speech detector looks for syllabic rate variations or speech. The noise sample or noise band channel will have low energy when there is speech due to functioning of the AGC and the voice or speech detector will have high energy due to the speech. This concept works in conventional applications and also gives a certain amount of rejection of CW signals in the output of the AM detector as long as the interfering signals do not fall in the bandwidth (BW) of either channel band-pass filter.

What is needed is the capability to not trigger the squelch circuit when several CW interferers are present in the intermediate frequency (IF) or baseband channel of the radio. These CW interferers may be much stronger than a desired signal. The squelch circuit should trigger with all levels of desired input signals with or without the undesired CW interferers that may be of greater or lower signal strength than the desired signal.

SUMMARY OF THE INVENTION

A multiband squelch circuit for a radio receiver to detect the presence of speech and enable an audio output device is disclosed. A filter bank with a group of band-pass filters or a polyphase filter for filtering an intermediate frequency or a baseband signal from the radio receiver into a plurality of band-pass signals is employed. The magnitudes of the band-pass signals received from the filter bank are determined in a magnitude detector function. The magnitudes of the band-pass signals are passed to a speech detector where a signal averager determines the average values of the band-pass signal magnitudes. A syllabic filter filters the average values to obtain the voice band average signals and a second filter further filters the voice band average signals from the syllabic filter. A syllabic differencer determines the difference signals between the voice band average signals and the second filter outputs. The difference signals are indicative of a syllabic rate of speech when the voice band average signals are greater than the second filter outputs. A maximum value selector selects a maximum difference signal that indicates there is speech present in the speech detector and that a speech detector decision is made. A commutator selects the voice band average signal that is associated with the maximum difference signal. The magnitudes of the band-pass signals are also passed to a noise detector where a peak detector determines the peak values of the signal magnitudes. The peak values are then filtered by an unsymmetrical low-pass filter to obtain noise detector signals. A minimum value selector selects a lowest noise detector signal from the noise detector signals. A threshold function scales the voice band average signal associated with the maximum difference signal and a hilo differencer determines a hilo difference signal between the lowest noise detector signal and the scaled voice band average signal associated with the maximum difference signal. The hilo difference signal is indicative of the presence of speech and a noise detector decision is made when the lowest noise detector signal is less than the scaled voice band average signal. An AND logic function determines the final decision signal to enable the audio output device when the speech detector decision and the noise detector decision both indicate speech. A hang counter passes the final decision signal to enable the audio output device and to hold the audio device on for a predetermined hold time to prevent on/off triggering of the audio.

It is an object of the present invention to provide a squelch circuit that does not trigger with several CW interferers in the intermediate frequency (IF) or baseband channel of the radio when the CW interferers are much stronger than the desired signal when it is present.

It is another object of the present invention to provide a squelch circuit that triggers with all levels of desired input signals with or without the undesired CW interferers that may be of greater or lower signal strength than the desired signal.

It is an advantage of the present invention to provide a squelch circuit that can be implemented using digital signal processing techniques.

It is a feature of the present invention to implement the squelch circuit in a polyphase filter implementation requiring reduced signal processing resources.

These and other objects, features, and advantages are disclosed and claimed in the specification, figures, and claims of the present application.

DETAILED DESCRIPTION

Figure 1:
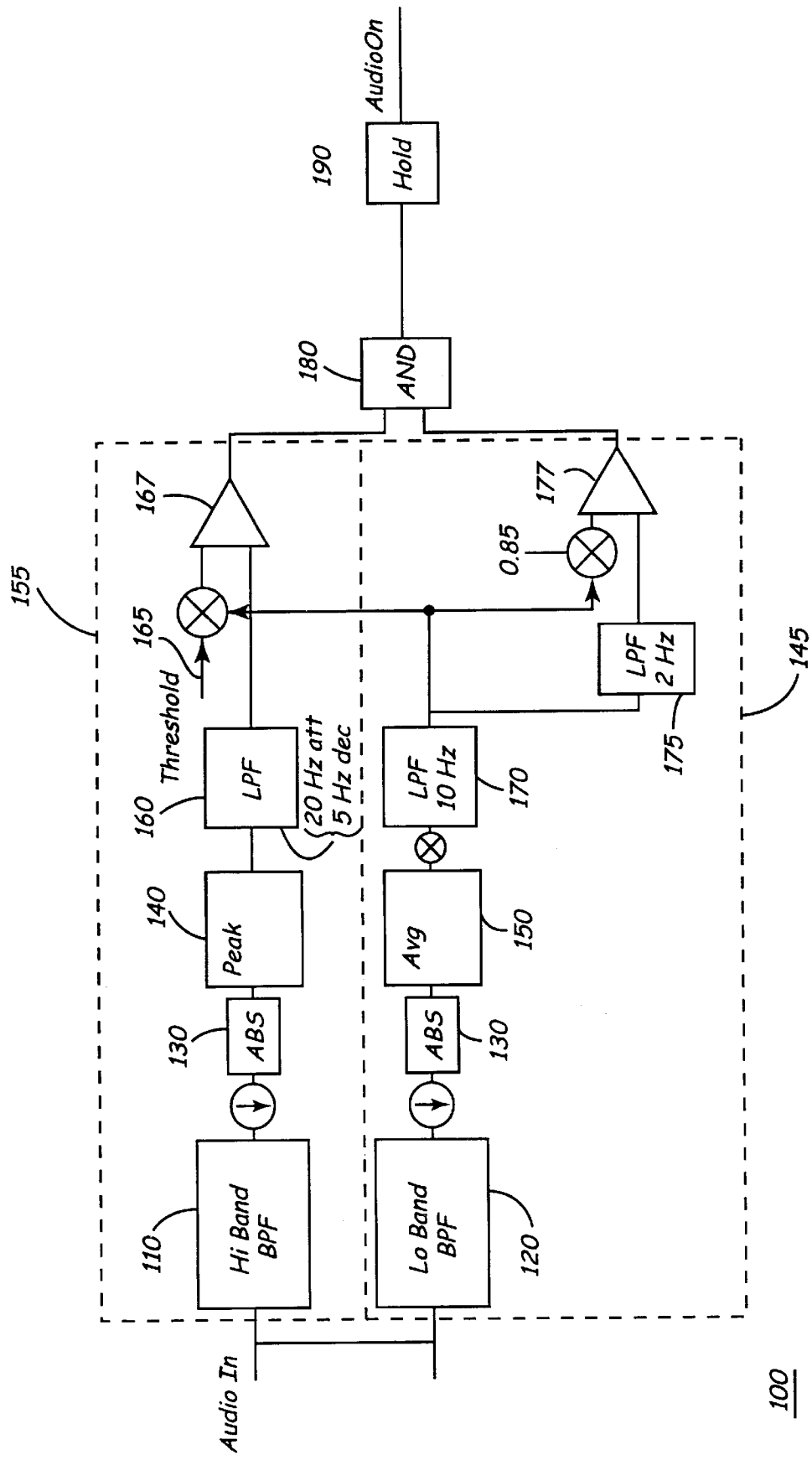
FIG. 1 is a block diagram based on the patented squelch circuit of U.S. Pat. No. 4,414,689.

The squelch circuit 100 shown in FIG. 1 is based on U.S. Pat. No. 4,414,689. The squelch circuit 100 continuously examines the characteristics of the audio input signal to determine whether it is sufficiently similar to speech to meet the decision threshold. Based on this determination the squelch circuit 100 decides whether to pass the audio to the output device such as a loudspeaker of a headset. This function makes a squelch decision on the basis of an in-band signal-to-noise measurement, as compared to the selected threshold.

The squelch circuit 100 operates on 8 samples at 8 kHz (1 ms of data) of the audio input signal. The input signal is fed to a high-band channel 155 and a low-band channel 145 with two band-pass filters 500 Hz wide, one centered at 600 Hz (low band) 120, the other centered at 2300 Hz (high band) 110. The low-band filter 120 contains voice energy, and the high-band filter 110 contains mostly noise, with less voice energy. The low-band filter 120 is wide enough to include significant voiced speech spectrum of all speakers. The bandwidths of both filters are the same because of the way the detectors are designed, but the exact bandwidth is not critical to performance.

The absolute value circuits 130 rectify both the high-band filter 110 and the low-band filter 120 outputs. The high-band filter 110 output is peak detected 140. The high-band peak detector output is filtered with a fast-attack, slow-decay filter 160. The low-band filter 120 output is average detected 150. A simple low-pass filter, called the syllabic filter 170, is used on the output of the average detector 150. When only noise is present, the high-band filter 110 and peak detector 140 produce an output greater than that of the syllabic filter 170 and average detector 150 by a ratio determined by the characteristics of the two detectors. Since a voice signal's frequency content is skewed to the lower frequencies, a voice signal will produce a larger output at the low-band average detector 150 than that at the high-band peak detector 140. This is the first condition required to trigger the squelch circuit as determined by the high-band comparator 167. Different squelch trigger thresholds are provided for on the threshold input 165. The low-band filter 120 and average detector 150 output is further processed by the 10-Hz low-pass syllabic filter 170, so that only signals with a periodic or syllabic rate of approximately 10-Hz and below will meet the second condition for triggering the squelch circuit. Low-band comparator 177 compares the syllabic filter 170 output and the 2-Hz low-pass filter 175 output to make the syllabic rate determination. The AND logic circuit 180 enables the squelch function when the two squelch conditions are met as determined by the two comparators. After the squelch decision has been made, the audio is held on for a decay time of 1.2 seconds provided by the hold function 190.

Figure 2:
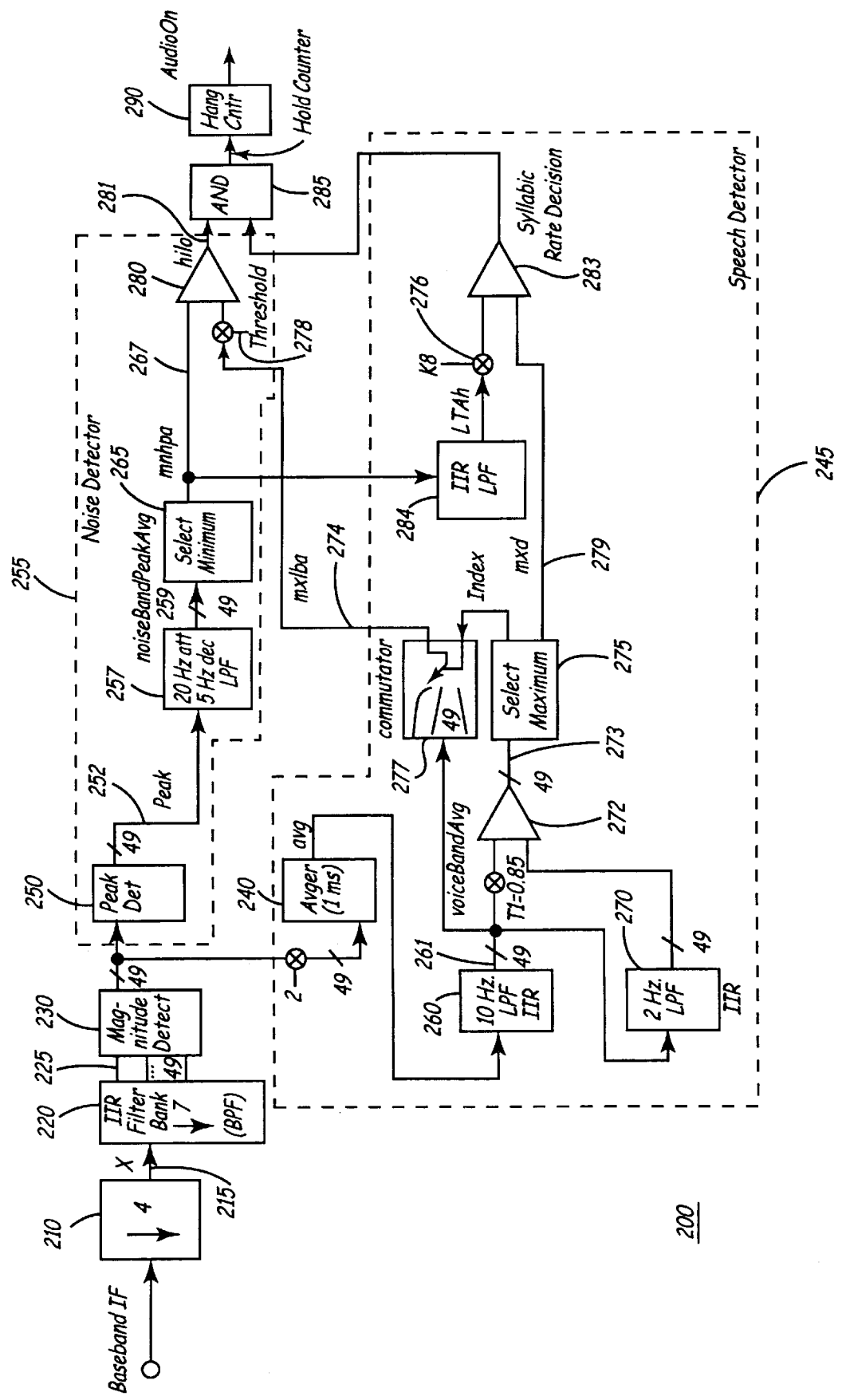
FIG. 2 is block diagram of the multiband squelch circuit of the present invention employing band-pass filter bank.

The band-pass multiband squelch circuit 200 is shown in exemplary fashion in FIG. 2. In the band-pass multiband squelch circuit 200, portions of the squelch circuit of FIG. 1 are used and improvements are made for increased rejection of CW interference. A digital signal processing (DSP) approach is used. The DSP solution does not trigger (audio on) on unmodulated carriers and effectively detects syllabic speech variations in the modulation even in the presence of up to five CW interferers. Up to five CW interferers was selected as a design goal but more than five can be tolerated. This multiband squelch circuit is implemented in the IF and it works with up to a +/−5-kHz carrier offset.

A problem exists with using the AM detector output of a radio receiver for a squelch circuit in the presence of CW interferers. Strong CW in the IF causes signal translation in the output of the AM detector. Weak CW signals have a lesser effect. Also, the intermodulation frequencies in the AM detector output resulting from closely spaced, strong CW at its input can be close together with far too many harmonics to deal with practically. In short, the AM detector is effectively an interference multiplier. For this reason the squelch circuit of the present invention functions at the IF or at baseband of a radio receiver.

The squelch circuit 100 of FIG. 1 detects the presence of speech if there is a clear channel indicating noise energy as well as a clear channel indicating speech energy. The need is to work in the IF or baseband with a bandwidth (BW) of typically 8.5 kHz for wide band (WB) and 3.6 kHz for narrow band (NB) in the presence of CW interferers. Since most speech energy normally occurs below 1000 Hz and since the need is to tolerate up to five CW interferers, a bank of band-pass filters (BPF) (220 in FIG. 2) with each filter having a bandwidth of typically 100 Hz is used. More than five CW interferers can be tolerated by reducing the bandwidth of the band-pass filters. The filter bank 220 replaces the high-band filter 110 and low-band filter 120 of FIG. 1. Since some speakers only contain significant spectral energy spanning about 500 or 600 Hz, five bands can be occupied with CW and still leave one or more bands for detecting speech. In the worst case all five CW interferers could fall exactly at the cross over points of five of the BPFs that would render the ten filter outputs useless. Using 50 Hz or narrower BPFs would solve this worst case if enough throughput and memory were available in the digital signal processor. Another solution to this problem is to use non-overlapping band-pass filters. This worst case scenario would likely cause squelch circuit failure (assuming BPFs with about 100 Hz BW) depending upon the spectral content of the speaker. However, the next worse case with five bands occupied by strong CW but not at the cut-off frequencies can be handled successfully even though the speaker is baritone with the band-pass multiband squelch circuit of the present invention. Carrier offset merely moves the voice energy around in the IF and has no effect on the multiband squelch circuit algorithm performance. As long as offset is below 5 kHz, any voice energy present will occupy one or more of the BPF channels.

The baseband IF sample rate used in the embodiment of FIG. 2 is 84 ksps into the band-pass multiband squelch circuit 200. Other IF sample rates can also be used to implement the present invention. Since the IF filter of a radio receiver is typically 8.5-kHz wide in the pass band and 15-kHz wide in the stop band in an AM mode, the IF signal, after translation to dc, is decimated by 4 to 21 ksps by decimator 210 without filtering before being processed by the squelch circuit of the present invention. Other decimation rates can be used. Assuming a maximum carrier offset of 5 kHz in the wide-band mode both upper and lower sidebands of the AM signal are still under the IF filter (allowing for 3.5-kHz voice BW). Since only one sideband is needed to detect speech, forty-nine 100-Hz wide band-pass filters cover the band up to 5 kHz (the band from 0 to 100 Hz is eliminated as not useful). Note that this present description of the filter bank embodiment of the present invention considers positive frequencies and that processing negative frequencies requires another 49 channels in this embodiment. In addition if filter bandwidths other than 100 Hz are used more or less than 49 filters can be used as needed to cover the desired offset frequency range.

Each of the 49 filter bank outputs 225 are magnitude detected in the embodiment shown in FIG. 2 and passed to the rest of the filter bank multiband squelch circuit. The magnitude detector 230 is an absolute value detector function in the band-pass multiband squelch circuit 200 but can be replaced with other functions to determine the magnitude of signals in the filter bank outputs. For example an envelope detector, a peak detector, a power detector, energy detector, a vector magnitude detector, or a detector for any metric proportional to signal strength can be used. For purposes of the description of the band-pass embodiment of the present invention, an absolute value detector will be referred to. The filter bank outputs are processed in a noise detector 255 and a speech detector 245.

The IF or baseband waveform, x, (215 in FIG. 2) is filtered by each of the band-pass filters of the filter bank 220. The filters are implemented as three cascaded biquad sections with outputs described by Equations 1a, b, and c. Equation 1 describes the filter in the 100 to 200 Hz band (band 10) when used with the coefficients which follow it.

$$y102_n := A10_{0,0} \cdot x_n + A10_{1,0} \cdot x_{n-1} + A10_{2,0} \cdot x_{n-2} - A10_{1,1} \cdot y102_{n-1} - A10_{2,1} \cdot y102_{n-2} \quad \text{Eqn. 1a}$$

$$y101_n := y102_n + A10_{1,2} \cdot y102_{n-1} + A10_{2,2} \cdot y102_{n-2} - A10_{1,3} \cdot y101_{n-1} - A10_{2,3} \cdot y101_{n-2} \quad \text{Eqn. 1b}$$

$$y10_n := y101_n + A10_{1,4} \cdot y101_{n-1} + A10_{2,4} \cdot y101_{n-2} - A10_{1,5} \cdot y10_{n-1} - A10_{2,5} \cdot y10_{n-2} \quad \text{Eqn. 1c}$$

$$A10 := \begin{bmatrix} .2163156910^{-2} & 1 & 1 & 1 & 1 & 1 \\ 0 & -.1980021110^1 & -.1993598610^1 & -.1994235210^1 & -.1999501410^1 & -.1987530910^1 \\ .2163156910^{-2} \cdot (-.1 \cdot 10^1) & .98179218 & .1 \cdot 10^1 & .99517742 & .1 \cdot 10^1 & .99089718 \end{bmatrix} \quad \text{Eqn. 1}$$

Next, the BPF outputs are decimated by D1=7 to 3 ksps and absolute value detected at block 230 of FIG. 2. Equation 2 below describes the decimation operation for band 10.

$$w10_{n1} := y10_{D1 \cdot n1} \quad \text{Eqn. 2}$$

Equation 3 is used in absolute value detection.

$$u10_{n1} := |w10_{n1}| \quad \text{Eqn. 3}$$

In the speech detector 245, the absolute value detected (AVD) signals from 230 are averaged, further decimated by D2=3 to 1 ksps, and scaled by 2 using Equations 4a and 4b by block 240 of FIG. 2. Since the speech detector computations use averaging, the AVD outputs are scaled by two to give values more comparable to the peak values used in the noise detector computations. The averaging method in Equation 4a is by a 3-tap boxcar filter but any method of averaging three values and decimating can be used.

$$avg10_{n3} := \frac{1}{D2} \cdot \sum_{i=0}^{D2-1} havg_i \cdot u10_{n3-i} \quad \text{Eqn. 4a}$$

$$avg1ms10_{n4} := avg10_{D2 \cdot n4} \cdot 2 \quad \text{Eqn. 4b}$$

The 1-ms average energy is filtered by syllabic filter 260 at 10 Hz for syllabic rate detection. A low-pass filter is shown in FIG. 2 for 260 but a band-pass filter can be used. The original low-pass filter was a 1-pole infinite impulse response (IIR) from the '689 patent. It does not give enough rejection of nearby CW to provide smooth enough decision signals. A third order IIR filter is used, but a second order filter may also be sufficient. The equation for the 1-pole design with $K2=2^{-4}$ is 5a, and the equation for the 3-pole design using coefficients A and B is 5b. Every band must be filtered to obtain the voice band average signal 261.

$$noiseBandAvg10_{n5} = K2 \cdot avg1ms10_{n5} - K2 \cdot noiseBandAvg10_{n5-1} + noiseBandAvg10_{n5-1} \quad \text{Eqn. 5a}$$

$$yy10_{s1} := A_0 \cdot x10_{s1} + (A_0 \cdot A_1 + A_0 \cdot A_2) \cdot x10_{s1-1} + (A_0 \cdot A_1 \cdot A_2 + A_0 \cdot A_3) \cdot x10_{s1-2} + A_0 \cdot A_1 \cdot A_3$$

$$\cdot x10_{s1-3}(-1) \cdot [(B_1+B_2) \cdot yy10_{s1-1} + (B_1 \cdot B_2+B_3) \cdot yy10_{s1-2} + B_1 \cdot B_3 \cdot yy10_{s1-1}] \quad \text{Eqn. 5b}$$

$$A := \begin{bmatrix} .1852128510^{-4} \\ .1 \cdot 10^1 \\ .2 \cdot 10^1 \\ .1 \cdot 10^1 \end{bmatrix}$$

$$B := \begin{bmatrix} 0 \\ -.95678722 \\ -.1953395410^1 \\ .95682427 \end{bmatrix} \text{from sq}|10h07$$

The syllabic filter 260 output is further filtered using the 2 Hz low-pass filter 270 described in Equation 6 with $K3=2^{-6}$. Here again a low-pass filter is shown but a band-pass filter can also be used.

$$longTermAvg10_{n5} = K3 \cdot voiceBandAvg10_{n5} - K3 \cdot longTermAvg10_{n5-1} + longTermAvg10_{n5-1} \quad \text{Eqn. 6}$$

In the noise detector 255, the absolute value detected signals are peak detected and further decimated by D2=3 to 1 ksps using Equations 7a and 7b in block 250. The maximum value of every three absolute value detector outputs is obtained. This functionality is performed by Equation 7a. Then, Equation 7b picks (decimates) the last one in the groups of three where the peak in that millisecond is stored. These equations implement a peak detector 250 where the input is at 3 ksps and the output peak values are at 1 ksps.

$$mx10_{n7} := \text{if}(\text{mod}(n7,D2)=0, u10_{n7}, \text{if}(u10_{n7} > mx10_{n7-1}, u10_{n7}, mx10_{n7-1})) \quad \text{Eqn. 7a}$$

$$peak1ms10_{n8} := mx10_{n8 \cdot D2+(D2-1)} \quad \text{Eqn. 7b}$$

The peak detector output 252 is low-pass filtered by a 1-pole IIR low-pass filter 257 with a nonsymmetrical attack and decay time. The attack time constant is faster than the decay time constant. This has the effect of making the output of the low-pass filter higher than it would be with equal attack and decay time constants, giving more separation between the two signals to be later compared as described below. Low-pass filter 257 can also be a band-pass filter. The low-pass filter 257 is described by Equation 8 below with $K0=2^{-3}$ and $K1=2^{-5}$. Note that the Heaviside step function is only being used to detect whether the input signal is increasing or decreasing with respect to the old average. This can be done better by just checking the sign of the difference and if $>=0$, attack, otherwise decay. The output of filter 257 is the noise band peak average signal 259.

noiseBandPeakAvg10$_{n9}$=K0·Φ(peak1ms10$_{n9}$−noiseBandPeakAvg10$_{n9-1}$)·(peak1ms10$_{n9}$−noiseBandPeakAvg10$_{n9-1}$)+K1·Φ(noiseBandPeakAvg10$_{n9-1}$−peak1ms10$_{n9}$)·(peak1ms10$_{n9}$−noiseBandPeakAvg10$_{n9-1}$)+noiseBandPeakAvg$_{n9-1}$     Eqn. 8

Part of the squelch decision involves comparing the energy in the speech detector 245 where voice normally is with the noise energy in the noise detector 255. However one channel for each band does not exist in the present invention. Each BPF output 225 is a channel or band. If there is speech in the IF, the noise signal should be a small signal and there should be high signal values where speech is present.

The squelch circuit of FIG. 1 looks at only the low-band energy to make the syllabic rate decision, which is the other part of the squelch decision. It compares the 2-Hz LPF 175 output with a scaled version (by 0.85) of the syllabic filter 170 output. Voice is indicated whenever the faster signal out of the syllabic filter 170 scaled by 0.85 is greater than the 2-Hz LPF 175 output (difference). In the band-pass multiband squelch circuit 200 of the present invention, the maximum difference of all the differences is computed for each channel output as in Equation 9 (for the 100- to 200-Hz band) with K4=0.85 at block 275 of FIG. 2.

$$d10_{n10}=K4 \cdot voiceBandAvg10_{n10}-longTermAvg10_{n10} \quad \text{Eqn. 9}$$

The maximum valued differences computed for all the channels are selected as the voice band syllabic rate indicator. The maximum value of the difference is compared to a threshold (276) set by a filtered (block 284) version of the minimum noise detector signal (mnhpa) 267 and hard limited to provide a Boolean decision (syllabic rate) at the syllabic decision comparator 283. The maximum value is selected at block 275 by collecting all 49 syllabic differencer (272) outputs 273 for each IF input sample into a vector and finding the maximum difference. The simulation collects all differences for all channels into one matrix (dMat) and chooses the maximum difference from each column and also saves the index or row where it found the maximum difference. Each row of dMat contains all the differences for all filter bank 220 outputs for one channel or band. Each column contains all the syllabic differencer 272 outputs for all channels for each IF sample input. The commutator 277 selects only the voiceBandAv signal 261 associated with or that caused the maximum difference. In other words, the rows of dMat represent increasing time and the columns of dMat represent increasing channel frequency for a given sample time. The simulation of this function used block processing (after all samples are captured) but the filter bank embodiment will process each column of samples in real time.

The matrix of maximum syllabic differencer outputs 273 is searched with Equation 10 (for the n10th sample time) on an input sample by input sample basis looking for the maximum differences. Equations 11 are used to select the maximum voiceBandAvg (mxlba) 274.

$$mxd_{n10}:=\max(dMat^{<n10>}) \quad \text{Eqn. 10}$$

The maximum syllabic difference (mxd) 279 is used to make the syllabic rate decision but the corresponding syllabic filter 260 output (voiceBandAvg 261) is used in the noise detector/speech detector decision in hilo differencer 280. Equations 11a and 11b sort through dMat (transpose) and save the index of the maximum channel. Equation 11c uses 11b to find the correct voice band values for use in computing the hilo output 281. The commutator 277 performs the selection.

$$j_{n10,i}:=\text{if}[mxd_{n10}=(dMatT)_{n10,i},i,0] \quad \text{Eqn. 11a}$$

$$jj_{n10}:=\max[(j^T)^{<n10>}] \quad \text{Eqn. 11b}$$

$$mxlba_{n10}:=lbaMat_{(jj_{n10}),n10} \quad \text{Eqn. 11c}$$

The syllabic decision comparator 283 threshold can be zero for the syllabic rate decision. This, however, leads to false alarms. It is desirable to find a suitable floating threshold that is dependent upon the signal to use as the threshold for the syllabic decision comparator 283 in the speech detector decision above. The signal chosen is the long-term average of mnhpa computed by Equation 14 below. The output of commutator 277 is the maximum voiceBandAv signal (mxlba) 274 and it can also be filtered to provide the floating threshold. When mxd 279 exceeds the threshold adjusted and filtered mnhpa signal (longTermavg or LTAh), speech is declared by the syllabic decision comparator 283. Equation 12 describes the speech detector decision for a threshold of K8=1.

$$low_{n10}:=\text{if}(mxd_{n10}>LTAh_{n10},\text{TRUE},\text{FALSE}) \quad \text{Eqn. 12}$$

The noise signal should be a small signal when a voice signal is present, therefore, the minimum valued samples out of the 20/5-Hz low-pass filtered, peak detected, BPF outputs are selected as the noise detector signal, mnhpa 267. This is done by collecting all channel outputs for each IF input sample into a vector and finding the minimum sample at block 265. The simulation collects all LPF samples for all channels into one matrix (hpaMat) and chooses the minimum sample from each column. Each row contains all the detected and filtered filter bank outputs for one channel or band. Each column contains all the outputs for all channels for each IF or basedetector input.

The matrix of LPF outputs is searched with Equation 13 on an input sample by input sample basis looking for the minimum samples. Equation 14 with $K3=2^{-8}$ computes the long-term average of mnhpa for use as a threshold in the speech detector decision as stated in the above section.

$$mnhpa_{n10}:=\min(hpaMat^{<n10>}) \quad \text{Eqn. 13}$$

$$LTAh_{n11}:=K3 \cdot mnhpa_{n11}-K3 \cdot LTAh_{n11-1}+LTAh_{n11-1} \quad \text{Eqn. 14}$$

The noise detector decision involves comparing the voice band energy to the noise detector energy in the hilo differencer 167 of FIG. 1 using a threshold that is dependent upon the signal to noise ratio (SNR) in '689 squelch circuit. In the band-pass multiband squelch circuit 200, a version of the voiceBandAvg (mxlba) scaled by the threshold 278 and associated with the maximum difference (mxd) is compared with the minimum noise detector signal (mnhpa) 267 in the hilo differencer 280 of FIG. 2. This comparison is computed by Equation 15 with threshold 278 equal to 0.2. The output of Equation 15, hilo 281, is the noise detector decision.

$$hilo_{n10}:=\text{if}(mxlba_{n10} \cdot threshold>mnhpa_{n10},\text{TRUE},\text{FALSE}) \quad \text{Eqn. 15}$$

The band-pass multiband squelch circuit 200 combines the noise detector and speech detector decisions to make a final decision about whether or not to pass the audio output to the listener in the AND function 285. Since it relies on the use of a hang counter 290 instead of hysteresis only as prior art squelches, Audio is TRUE any time holdCounter is non-zero. HoldCounter is computed as shown in Equation 16 and Audio is determined by Equation 17. HOLD_TC is the preset constant used for the maximum time constant on holdCounter and 1.2 seconds is used here as an example. Using 1 ksps implies HOLD_TC=1200.

$$\text{holdCounter}_{np} := \text{if}(\text{hilo}_{np} \cdot \text{low}_{np} > 0, \text{HOLD\_TCif}(\text{holdCounter}_{np-1} > 0, \text{holdCounter}_{np-1} - 1, \text{holdCounter}_{np-1})) \quad \text{Eqn. 16}$$

$$\text{Audio}_{n10} := \text{if}(\text{holdCounter}_{n10} > 0, \text{TRUE}, \text{FALSE}) \quad \text{Eqn. 17}$$

Figure 3:
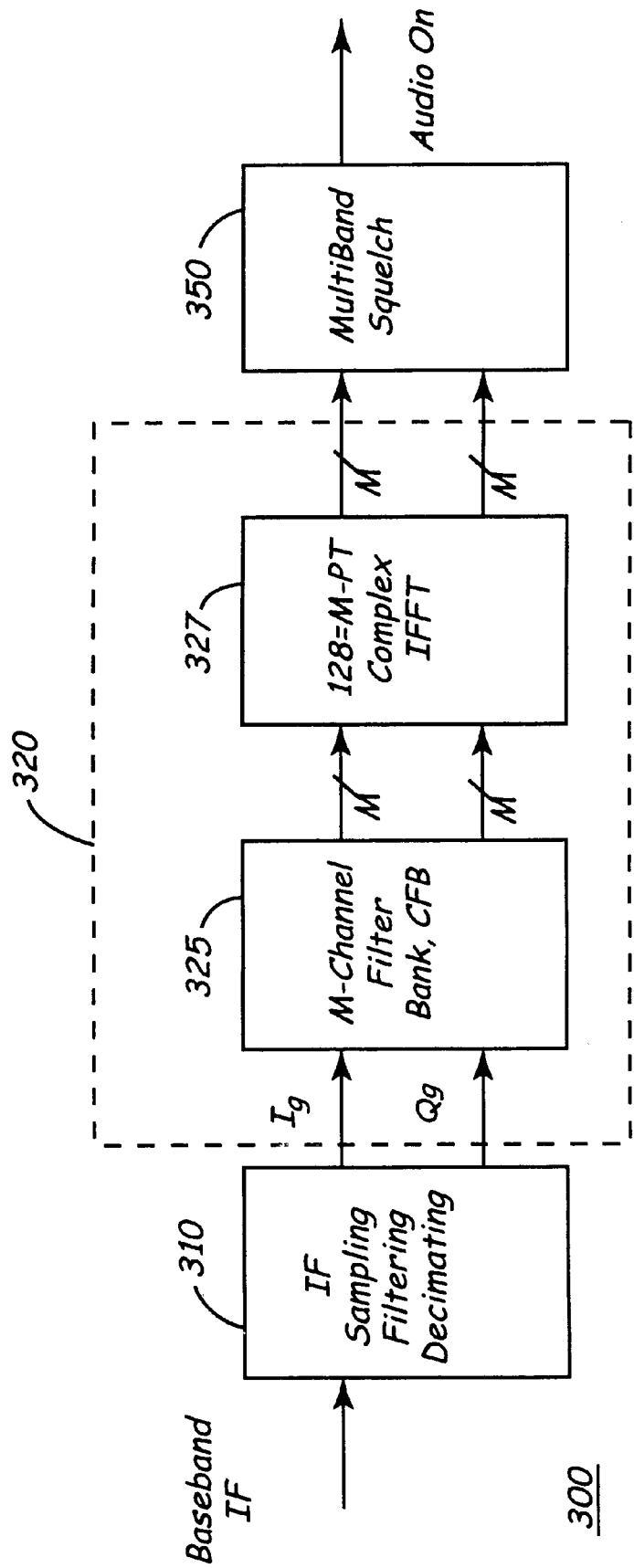
FIG. 3 is a simplified block diagram of an alternate embodiment of the present invention employing a polyphase filter.

The direct implementation of the band-pass multiband squelch circuit 200 is millions of instructions per second (MIPS) intensive. Shown in FIG. 3 is a simplified block diagram of an alternate and preferred embodiment of the multiband squelch circuit 300 using a polyphase filter 320. IF or baseband sampling and decimating is performed by block 310. The remainder of the multiband squelch circuit is shown as block 350.

The complex polyphase filter 320 is a finite impulse response (FIR) structure that can provide a highly efficient implementation of a filter bank of contiguous evenly spaced channel frequencies each of bandwidth B. The complex polyphase filter consists of an M-channel filter bank (CFB) 325 and an M-point complex inverse fast Fourier transform (IFFT) 327 where M is the total number of channels. The use of the IFFT instead of the FFT is dependent on the sense of the input data commutator (clockwise or counterclockwise). The M-channel filter bank 325 performs the filtering function while the M-point complex IFFT 327 examines each of the filter banks to determine if energy is present. C is the desired number of channels in the bandwidth of the sampled signal from 0 to fs/2 Hz where fs is the sample rate at the input of the polyphase filter. Since both the upper and lower sidebands of the complex signal are needed, 2C channels are used over 0 to fs Hz. The complex polyphase filter 320 allows factoring of the prototype FIR filter into 2C subfilters and decimation by 2C.

Figure 4:
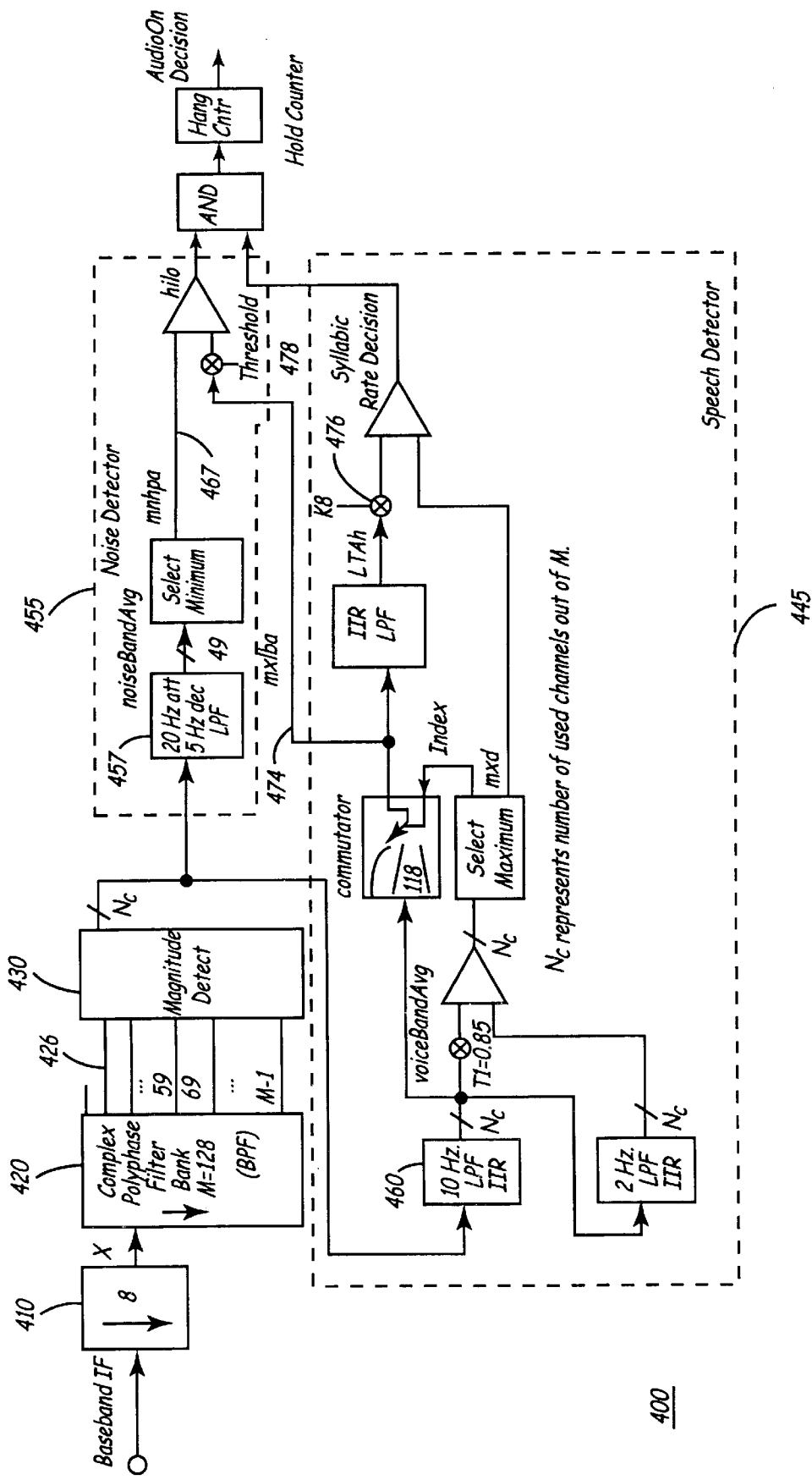
FIG. 4 is a detailed block diagram of an alternate embodiment of the present invention employing a polyphase filter.

FIG. 4 shows the detailed block diagram of a complex polyphase filter into the multiband squelch circuit 400 of the present invention. In this implementation fs is chosen to be 84 ksps and M is chosen to be 128 channels while other values can be used.

The input to the polyphase multiband squelch circuit 400 is decimated and filtered by block 410. The complex polyphase filter 420 operates on the decimated IF or baseband signal using a prototype 384-tap FIR filter. In the polyphase filter 420, the input signal is decimated by M=128 to 82 sps and divided into 128 complex bands or channels. Here again efficient implementation results in a power of two decimation (instead of 210) for the application of a complex FFT because the channel BW only needs to be in the vicinity of 100 Hz.

The polyphase filter outputs 426 are used by a magnitude detector function block 430. In the band-pass multiband squelch circuit 200 of FIG. 2 the magnitude detector 230 is an absolute value detector. The magnitude detector function 430 of FIG. 4 can be an envelope detector or an absolute value detector or can be replaced with other functions to determine the magnitude of signals in the polyphase filter outputs. For example a peak detector, a power detector, energy detector, or a vector magnitude detector can be used. For purposes of the description of the polyphase filter embodiment of the present invention, a magnitude detector will be referred to. The polyphase filter outputs 426 are processed in a noise detector 455 and a speech detector 445.

The peak detector 250 and average detector 240 of FIG. 2 are not used in this embodiment. The peaks are not averaged because the sample rate is decimated to the lowest possible rate by the polyphase filter 420. The sampling rate of 82 sps allows the use of FIR low-pass filters 457 and 460 in the noise detector 455 and speech detector 445 instead of the IIR filters (257 and 260) in the first approach. Low-pass filters IIR are shown for filters 457 and 460 but band-pass filters can be used. FIR filters equivalent to the IIR filters in FIGS. 1 and 2 require more processing and IIR filters are the more practical choice. The unsymmetrical filter 457 output is now a noise band average signal since a peak detector is not used. The speech detector decision threshold 476 is the same as before but can be derived from the minimum noise detector signal 467 (mnpha) or the maximum voice band average signal 474 (mxlba). The speech detector threshold is derived from mxlba in FIG. 4. The hilo threshold used is 0.2 as before and the speech detector threshold is 0.5 also as before. The remainder of the polyphase multiband squelch circuit 400 functions the same as the band-pass multiband squelch circuit 200 of FIG. 2.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. A bandpass multiband squelch circuit for a radio receiver having a receiver bandwidth to detect the presence of speech in a radio receiver output with a receiver bandwidth and enable an audio output device comprising:

a bandpass filter bank for filtering the radio receiver output into a plurality of bandpass signals said bandpass filter bank comprising a plurality of bandpass filters contiguously spaced in the receiver bandwidth;

a plurality of magnitude detectors coupled to the filter bank for detecting magnitudes of the band-pass signals from the bandpass filters;

a speech detector coupled to the magnitude detector wherein the speech detector determines when a syllabic rate of speech is present and generates a speech detector decision from the magnitudes of the bandpass signals;

wherein the speech detector further comprises:
an averager for averaging the magnitude detector outputs;
a syllabic filter connected to the averager for filtering the averager outputs to obtain a plurality of voice band average signals;
a second filter connected to the syllabic filter to further filter the voice band average signals;
a syllabic differencer connected to the syllabic filter and the second filter to obtain syllabic differences between the voice band average signals and the second filter outputs;
a maximum value selector connected to the syllabic differencer for selecting a maximum difference;
a commentator for selecting a voice band average signal associated with the maximum difference; and
a comparator to compare the maximum syllabic difference to the minimum noise detector signal to make the speech detector decision;

a noise detector coupled to the magnitude detector wherein the noise detector determines when a minimum noise detector signal is present and generates a noise detector decision from the magnitudes of the bandpass signals;

a logic device for determining a final decision signal from the speech detector decision and the noise detector decision; and a counter for passing the final decision signal to enable the audio output device when speech is present and to hold the audio device on for a predetermined hold time.

2. The squelch circuit of claim 1 wherein the magnitude detector is one of the group consisting of an absolute value detector, an envelope detector, a peak detector, a power detector, an energy detector, and a vector magnitude detector.

3. The squelch circuit of claim 1 wherein the noise detector further comprises:

a peak detector for determining peaks of the magnitude detector outputs;

an unsymmetrical filter connected to the peak detector for filtering the peaks;

a minimum value selector connected to the unsymmetrical filter for selecting a lowest peak to obtain the minimum noise detector signal;

a threshold connected to the commutator for scaling the voice band average signal associated with the maximum syllabic difference; and a hilo differencer for determining a hilo difference between the minimum noise detector signal and the scaled voice band average signal to make the noise detector decision.

4. The squelch circuit of claim 1 wherein the filter bank comprises a polyphase filter.

5. The squelch circuit of claim 4 wherein the speech detector further comprises:

a syllabic filter for filtering the magnitude detector outputs to obtain a plurality of voice band average signals;

a second filter connected to syllabic filter to further filter the voice band average signals;

a syllabic differencer connected to the syllabic filter and the second filter to obtain differences between the voice band average signals and the second filter outputs;

a maximum value selector connected to the syllabic differencer for selecting a maximum syllabic difference;

a commutator for selecting a voice band average signal associated with the maximum syllabic difference; and a comparator to compare the maximum syllabic difference to the voice band average signal associated with the maximum syllabic difference to make the speech detector decision.

6. The squelch circuit of claim 5 wherein the noise detector further comprises:

an unsymmetrical filter for filtering the magnitude detector outputs to obtain a plurality of noise band average signals;

a minimum value selector connected to the unsymmetrical filter for selecting the minimum noise detector signal;

a threshold connected to the commutator for scaling the voice band average signal associated with the maximum syllabic difference; and a hilo differencer for determining a hilo difference between the minimum noise detector signal and the scaled voice band average signal to make the noise detector decision.

7. A method for squelching an audio output of a radio receiver comprising the steps of:

filtering an intermediate frequency or baseband signal from the radio receiver into a plurality of band-pass signals;

detecting signal magnitudes of the plurality of band-pass signals to determine a plurality of signal magnitudes;

passing the signal magnitudes to a speech detector wherein the speech detector further performs the steps comprising:

processing the signal magnitudes to obtain a plurality of voice band average signals;

further filtering the voice band average signals;

comparing the voice band average signals and the further filtered voice band average signals to obtain syllabic difference signals;

selecting a maximum syllabic difference signal from the syllabic difference signals;

selecting a voice band average signal associated with the maximum syllabic difference signal; and comparing the maximum syllabic difference signal to a minimum noise detector signal to make a speech detector decision;

passing the signal magnitudes to a noise detector wherein the noise detector further performs the steps comprising:

processing the signal magnitudes to obtain a minimum noise detector signal;

scaling the voice band average signal associated with the maximum syllabic difference signal; and comparing the minimum noise detector signal and the scaled voice band average signal associated with the maximum syllabic difference signal to make a noise detector decision;

determining a final decision signal when the speech detector decision and the noise detector decision both indicate speech; and passing the final decision signal to enable the audio output when speech is present and to hold the audio output on for a predetermined hold time.

8. The method of claim 7 wherein the step of filtering the intermediate frequency or baseband signal from the radio receiver into a plurality of band-pass signals is performed by a bank of band-pass filters.

9. The method of claim 8 wherein the step of processing the signal magnitudes of the band-pass signals to obtain a plurality of voice band average signals further comprises the steps of averaging the signal magnitudes of the band-pass signals to obtain a plurality of average value signals and filtering the average value signals to determine a plurality of voice band average signals.

10. The method of claim 9 wherein the step of processing the signal magnitudes to obtain the minimum noise detector signal further comprises the steps of peak detecting the signal magnitudes of the band-pass signals to determine a plurality of peak values, filtering the peak values to obtain a plurality of noise band peak average signals, and selecting a minimum noise band peak average signal to obtain a minimum noise detector signal.

11. The method of claim 7 wherein the step of detecting the signal magnitudes of the plurality of band-pass signals is performed by one of the group consisting of an absolute value detector, an envelope detector, a peak detector, a power detector, an energy detector, and a vector magnitude detector.

12. The method of claim 7 wherein the step of filtering the intermediate frequency or baseband signal from the radio receiver into a plurality of band-pass signals is performed by a polyphase filter.

13. The method of claim 12 wherein the step of processing the signal magnitudes to obtain a plurality of voice band average signals further comprises the step of filtering the signal magnitudes to determine a plurality of voice band average signals.

14. The method of claim 13 wherein the step of processing the signal magnitudes to obtain the minimum noise detector signal further comprises filtering the signal magnitudes to obtain a plurality of noise band average signals and selecting a minimum noise band average signal to obtain a minimum noise detector signal.

* * * * *